(12) United States Patent
Barry et al.

(10) Patent No.: US 6,240,038 B1
(45) Date of Patent: May 29, 2001

(54) LOW AREA IMPACT TECHNIQUE FOR DOUBLING THE WRITE DATA BANDWIDTH OF A MEMORY ARRAY

(75) Inventors: Mike Barry, Fort Collins; Samuel D Naffziger, Ft. Collins, both of CO (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/510,272

(22) Filed: Feb. 21, 2000

(51) Int. Cl.[7] ....................................................... G11C 8/00
(52) U.S. Cl. ............... 365/230.06; 365/233; 365/230.05; 365/230.01; 365/189.08; 365/189.01
(58) Field of Search ........................ 365/189.01, 189.05, 365/189.08, 230.01, 230.05, 233, 230.06

(56) References Cited

U.S. PATENT DOCUMENTS

| | | | |
|---|---|---|---|
| 4,987,559 | * | 1/1991 | Miyauchi et al. ............... 365/189.04 |
| 5,652,725 | * | 7/1997 | Suma et al. .......................... 365/200 |
| 5,668,774 | * | 9/1997 | Furutani ............................... 365/233 |
| 5,680,361 | * | 10/1997 | Ware et al. ...................... 365/230.01 |
| 5,844,849 | * | 12/1998 | Furutani .............................. 365/194 |
| 5,956,285 | * | 9/1999 | Watanabe et al. ............. 365/230.03 |
| 5,959,930 | * | 9/1999 | Sakurai ........................... 365/230.03 |
| 6,128,428 | * | 10/2000 | Idei et al. ............................. 365/233 |

\* cited by examiner

*Primary Examiner*—Viet Q. Nguyen

(57) ABSTRACT

The present invention provides a scheme for twice writing data into an array of memory cells with a single array write port during each clock cycle. In this invention, data is written into the memory array in the first write operation with row enable and write data signals that are generated during the first phase of a clock signal. Data is then written in the second write operation with row enable and write data signals generated during the second phase of the clock signal. In this way, each clock phase is separately used for writing data into the memory array. Accordingly, twice as much data may be written during every cycle.

14 Claims, 4 Drawing Sheets

LOW AREA IMPACT TECHNIQUE FOR DOUBLING THE WRITE DATA BANDWIDTH OF A MEMORY ARRAY

BACKGROUND

Memory array write ports write data into the memory cells of synchronous memory arrays. They are used in various environments such as in memory controllers and microprocessors that have on-board memory arrays.

With reference to FIGS. 1 through 3 and particular reference to FIG. 1, a typical array write port 75 is shown for writing data into a conventional memory array 85. The memory array 85 includes an array of m rows by n columns of memory cells 87.

Array write port 75 generally includes row address decoders UR1 through URm and a write driver section, which includes write gates UC1 through UCn. Each row address decoder receives Row Address and Clock signals at its inputs and outputs a Row (e.g., Row 1, Row m) enable signal to each cell within its associated row. The Clock is a conventional two-phase clock. The Row Address signal consists of multiple address line bits for selecting (identifying) a unique address for each of the m rows within the system. Thus, the Row Address inputs for each row address decoder could actually include inputs (inverted or non-inverted) for each address line in order to identify a specific row. When the "correct" address is input from the Row Address line to a given row address decoder, an active (e.g., High) Row signal is output from the decoder if the clock is High. The active Row signal enables each cell within the row to be written to if its associated column is also activated.

The writegates UC1 through UCn each have inputs for receiving the clock signal, write data, and a column address signal (which is not shown). When activated, the write gate outputs a WData signal to each cell within its column for writing the WData value into one or more of these cells whose row is enabled by a Row enable signal. Each write gate has decoding capability for decoding an associated column address from the column address signal. If the column address for a given gate is present and the clock signal is active, the WData value applied at the gate's input will be outputted from the write gate and thus written to any cell in its column that has an active Row signal. With this array write port, data may be written to individual cells or even to whole rows of memory cells 87.

FIG. 2 shows the relevant portion of a typical memory cell 87. Memory cell 87 generally includes FETs Q1–Q4, which form a cross-coupled inverter pair, FETs Q5, Q6, which form a cell write port, and a cell read port (not shown). PFET Q1 and NFET Q2 are connected in a conventional inverting arrangement with their gates and drains tied together. Likewise, PFET Q3 and NFET Q4 are connected in the same way as an inverter. The Q3/Q4 gates are coupled with the Q1/Q2 drains to form a Data node for storing data in the cell, and the Q1/Q2 gates are coupled with the Q3/Q4 drains to form an NData (not Data) node for storing the data complement. The cell write port includes NFETs Q5 and Q6. The Q5 and Q6 drains are connected to the NData and Data nodes, respectively. Their gates are tied together and serve as the input for receiving the Row enable signal from the array write port 75. The source of Q5 is an NBit input with the source of Q6 being a Bit input. These Bit and NBit inputs function together as a differential input for receiving a WData signal in order for data to be written into the Data and NData nods. (Thus, when memory cells 87 are used with array write port 75, write drivers 315 provide differential WData signals.) When Row is active (or High), the value of WData is written into the Data/NData nodes through either Q5 or Q6 that is, if WData is High (i.e., Bit is sufficiently High relative to NBit), then Q5 turns on and pulls down NData (if not already Low), which ensures that Data will be High. Likewise, if WData is Low (i.e., NBit is High relative to Bit) and Row is High, then a High is written into NData and a Low is written into the Data node.

FIG. 3 shows a timing diagram for the various signals in the array write port 75 when WData is written into a memory cell. The diagram shows the clock signal 100, the Row signal 110, the WData signal 120, and the state of the cell data 130. When the clock is High and a Row signal goes High, WData is written into a memory cell. As shown at 130, after the Row goes High and the WData is asserted, old data at 132 is replaced with the new data 134 from the WData signal. One clock phase is used to actively write the data, and the other phase is used to recover and set up for the next clock cycle.

One drawback of such an array write port is that only one row of data maybe written into the memory array during each clock cycle. One solution to overcome this problem has been to utilize multiple array write ports connected in parallel across the cell write port of a memory array. In this way, each cell or row of cells can be independently written to with each array write port. This solution may not be practicable, however, in most IC applications where component and wire resources are at a premium.

Accordingly, what is needed is an improved scheme for writing data into a memory array.

SUMMARY OF THE INVENTION

The present invention provides a scheme for twice writing data into an array of memory cells with a single array write port during each clock cycle. In this invention, data is written into the memory array in the first write operation with row enable and write data signals that are generated during the first phase of a clock signal. Data is then written in the second write operation with row enable and write data signals generated during the second phase of the clock signal. In this way, each clock phase is separately used for writing data into the memory array. Accordingly, twice as much data may be written during every cycle.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

The present invention provides an improved array write port that is capable of multiple write operations to a memory array during each clock cycle. The improved array write port writes data in both phases of a clock cycle rather than in just a single phase. In this way, the write data bandwidth is exactly doubled without having to use proportionally extra hardware.

Figure 1:
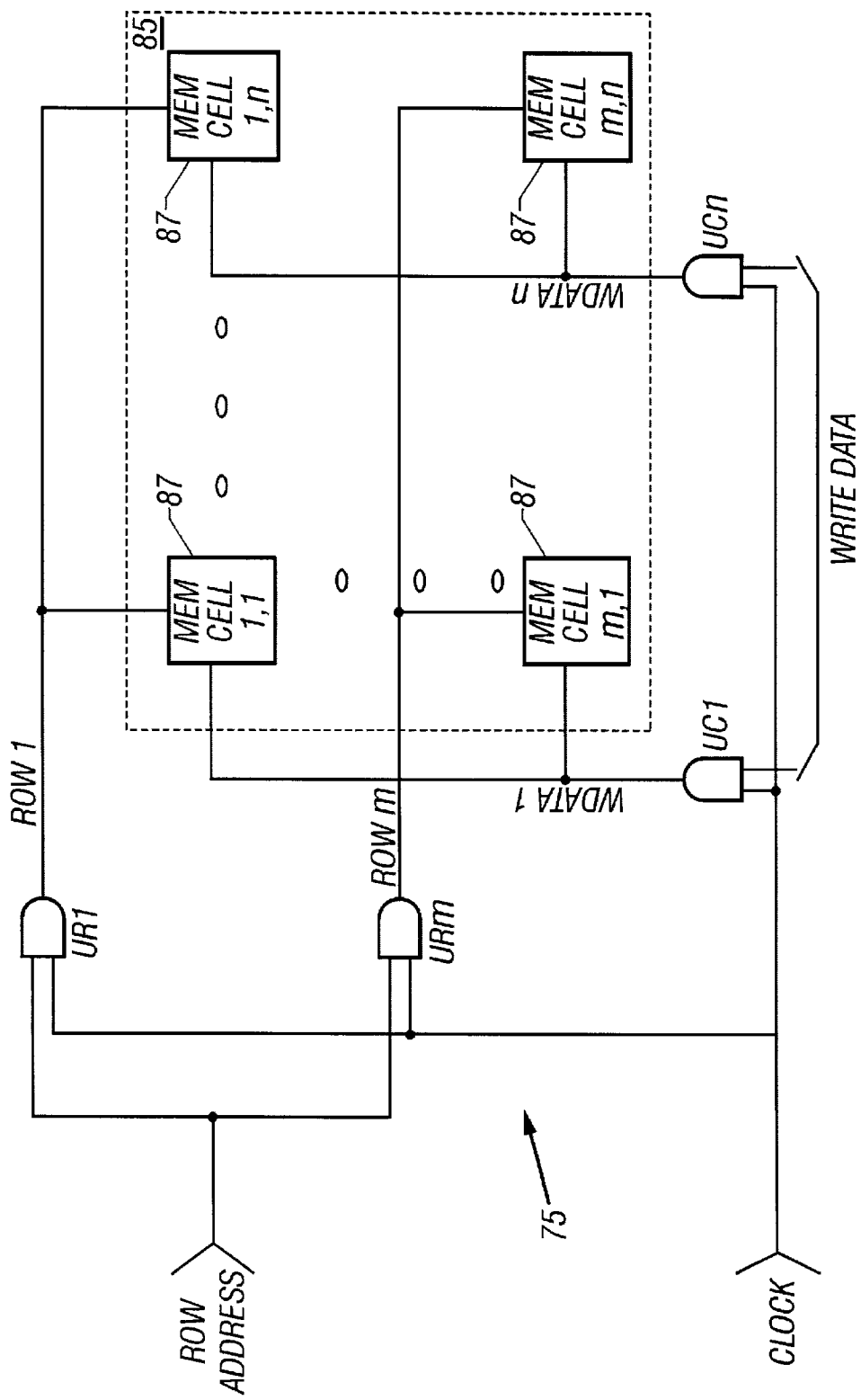
FIG. 1 shows a block schematic of a conventional prior art array write port.
Figures 2, 3:
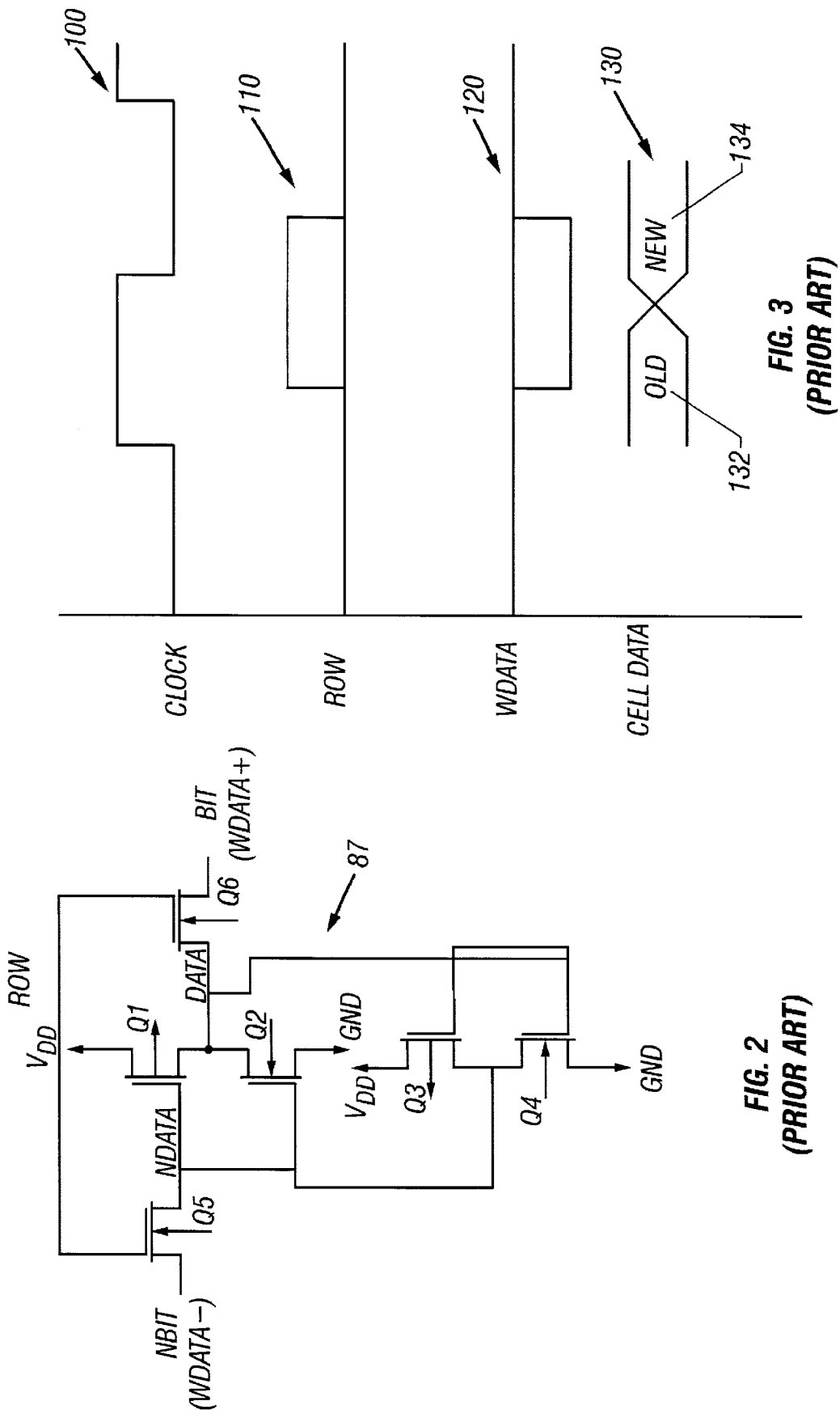
FIG. 2 shows a partial schematic of a prior art memory cell from a memory array.
FIG. 3 shows a timing diagram with various signals from the array write port of FIG. 1.
Figure 4:
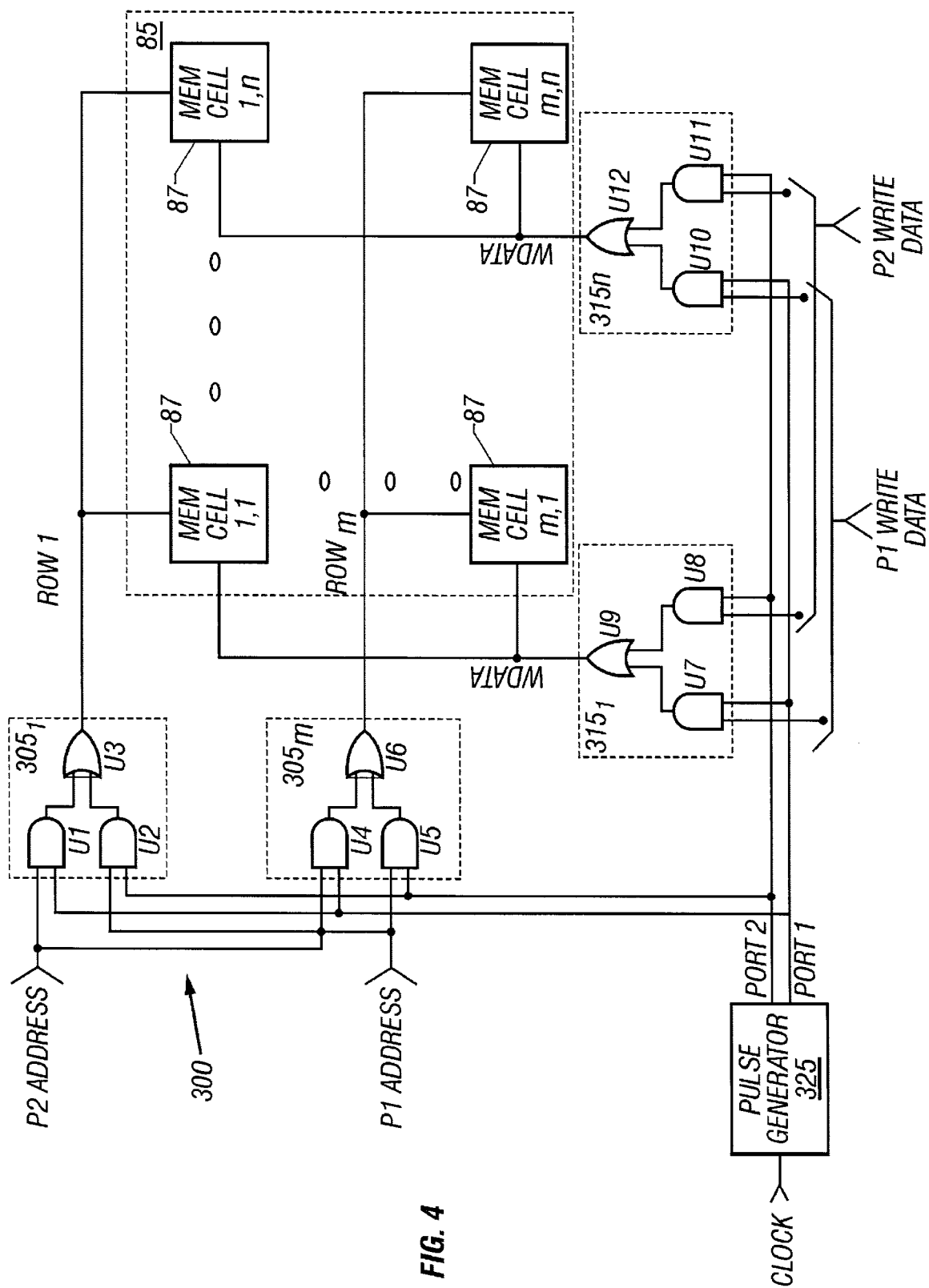
FIG. 4 shows a block schematic of one embodiment of an array write port of the present invention.

FIG. 4 shows a block schematic of one embodiment of an array write port 300 for writing data with the present invention into a m by n memory array 85 of memory cells 87. Array write port 300 generally includes row decoders $305_1$ through $305_m$, write gates 3151 through 315n, and pulse generator 325.

A row decoder may be any logical circuit for providing a Row enable signal for write enabling a row of memory cells in response to receiving a synchronously generated port signal and a particular row address that selects (or identifies) the decoder. Row decoder $305_1$ includes port 1 decoder gate U1, port 2 decoder gate U2, and OR gate U3. The inputs of the port 1 gate are connected to a Row Address signal and to a port 1 pulse signal, which is output from the pulse generator 325. Similarly, the Row Address signal and a port 2 pulse signal (also from the pulse generator 325) are connected as inputs to the port 2 decoder gate U2. The outputs from both of these decoder gates U1, U2 are connected as inputs to the OR gate U3. The output of OR gate U3 provides a Row 1 enable signal.

Row decoder $305_n$ includes port 1 decoder gate U4, port 2 decoder gate U5, and OR gate U6. The Row Address signal and port 1 pulse signal are connected as inputs to the port 1 decoder gate U4. Likewise, the Row Address signal and port 2 pulse signal are connected as inputs to the port 2 decoder gate U5. The outputs from the U4 and U5 decoder gates are fed as inputs into the OR gate U6. A Row m enable signal is provided at the output of OR gate U6. Each of the remaining $305_2$ through $305_{m-1}$ row address decoders are configured in the same manner.

A write driver may be any suitable logical circuit for providing a write data signal from an input write data signal in response to receiving a particular column address and a synchronously generated port signal. The outputted write data signal is for writing the input write data value into one or more cells within an associated column of memory cells. One embodiment of such a column write gate 315 is shown in FIG. 4.

The column 1 write driver $315_1$ includes port 1 write gate U7, port 2 write gate U8, and OR gate U9. The port 1 and port 2 write gates U7 and U8 each include column address decoding with appropriate column address signal inputs (not shown). In addition, the port 1 pulse signal and the Port 1 Write Data signal are fed into the port 1 write gate U7. Similarly, the port 2 pulse signal and the Port 2 Write Data signal are input into the port 2 write gate U8. The outputs from these write gates U7, U8 are input into OR gate U9. In turn, the output of OR gate U9 provides a the WData signal for the first column. In the depicted embodiment, this WData output is differential for driving differential cell write port inputs of the memory cells 87 in the column.

Similarly, the column n write driver $315_n$ includes port 1 write gate U10, port 2 write gate U11, and OR gate U12. The port 1 and port 2 write gates U10 and U11 each include column address decoding with appropriate column address signal inputs (not shown). In addition, the port 1 pulse signal and the Port 1 Write Data signal are fed into the port 1 write gate U10. Similarly, the port 2 pulse signal and Port 2 Write Data signal are input into the port 2 write gate U11. The outputs from these write gates U10, U11 are input into OR gate U12. In turn, the output of OR gate U12 provides the WData signal for the nth. Column in the array. This WData output is also differential for driving the differential cell write port inputs of the memory cells 87 in the column. Each of the remaining $315_2$ through $315_{n-1}$ write drivers are configured in this manner.

The pulse generator 325 has an input for receiving a conventional two-phase clock signal. It also has first and second outputs for providing the port 1 and port 2 pulse signals, respectively. The pulse generator 325 generates a pulse each time the clock signal transitions from either the first to the second phase or from the second to the first phase. During each transition, either a port 1 or a port 2 pulse is provided. In the depicted embodiment, a second (Low) to first (High) phase transition causes the port 1 pulse to be generated during the first clock phase. Likewise, a first to second phase transition causes the port 2 pulse to be generated during the second clock phase. In addition, the pulse generator ensures that the pulses do not overlap with one another. In one embodiment, both the port 1 and port 2 pulses occur shortly after the clock transition and are sustained for about 40% of their respective phases. That is, they approximately have a 20% duty cycle with respect to the overall clock cycle. This gives the write port 300 sufficient time to recover and set up for the next write operation.

The operation of a row decoder will now be described. With each port decoder gate (e.g., U1, U2, u4, u5), an active (High) signal is provided at the output to its corresponding OR gate (e.g., U3, u6) when its associated row address is present at the Row Address signal and when its port pulse signal is active. This corresponds to a row being activated for a given port. If either a port 1 or port 2 decoder gate is activated, its corresponding OR gate outputs an active Row enable signal, which allows data to be written to the memory cells 87 within the row.

With regard to the operation of a write gate, each write gate (e.g., U7, U8, U10, U11) transfers to its corresponding OR gate (e.g., U9, U12) the value of its inputted (port 1 or port 2) Write Data signal in response to receiving a port pulse signal when it decodes its associated column address from a column address signal (not shown). Because only one of the port 1 or port 2 pulses is active at any given time, this Write Data value is transferred through to the output of its associated OR gate as the WData signal, which is provided to the cells within the column of memory cells. For example, if the value of P2 Write Data is High and the Port 2 pulse is active (and thus, the port 1 pulse is not active), then if the column address for column 1 is been decoded in U7, a High signal is outputted from U7. In turn, this outputted value (whatever it is—in this case High) is transferred to the output of OR gate U9 at WData because the output of U8 will be Low with the port 1 signal being Low. The value of WData will be written into any cell within the column whose row is activated (or enabled) by a row address decoder.

Figure 5:
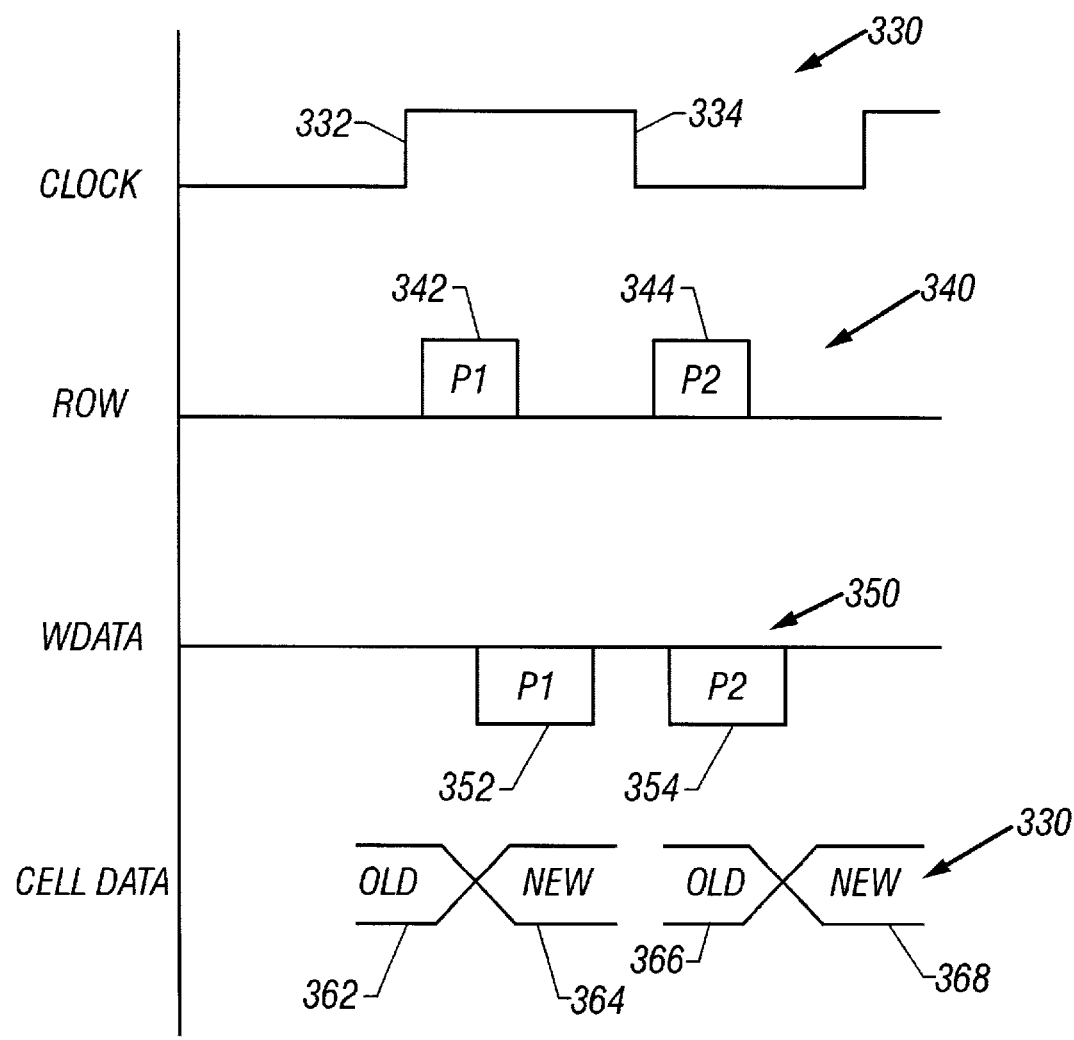
FIG. 5 shows a timing diagram with various signals for the array write port of FIG. 4.

With reference to FIG. 5, the operation of the overall array write port 300 will be described. A conventional two-phase clock signal 330 is provided. It has a rising edge 332 and a falling edge 334. In the depicted embodiment, these rising and falling edges cause the pulse generator to generate port 1 and port 2 pulses (not shown), respectively. The port 1 pulse causes a corresponding Row pulse 342 to be generated. In turn, the port 2 pulse, which occurs in the clock's second phase, causes a second Row enable pulse 344 to be generated. A port 1 WData signal 352 is generated by a write driver during the port 1 Row enable pulse 342. This causes new data 364 from this WData signal 352 to replace old data 362 in the written to memory cell. Similarly, a port 2 WData signal 354 is generated by a write driver while the port 2

Row enable pulse is occurring. This causes old data at 366 to be replaced by the new data 368 from the WData signal 354 in the written to memory cell.

The timing diagram of FIG. 5 shows how data may be twice written during a clock cycle with an array write port 300 of the present invention. The cell data representation at 330 could correspond to one cell or to two different cells depending upon the particular Row/Column combination that is activated. Moreover, the array write port of the present invention can simultaneously write to multiple cells—whether or not they are in the same row and/or column—depending upon the particular circuit configuration and decoding scheme. What is significant about the present invention is that it allows data to be written in both clock phases rather than in just a single phase, which doubles its write bandwidth capability.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the, present invention. Accordingly, the appended claims are intended to include within their scope such processes, machines, manufacture, compositions of matter, means, methods, or steps.

What is claimed is:

1. An array write port for writing to an array of memory cells, comprising:
    a row decoder operably connected to a row of one or more cells to provide a row enable signal for enabling the one or more cells, the row decoder having a row address input for receiving a row address signal, a port 1 input for receiving a port 1 signal, a port 2 input for receiving a port 2 signal, and an output for generating the row enable signal in response to being selected by the row address signal and receiving one of the port 1 and port 2 signals;
    a write driver for writing data into the one or more cells, the write driver having port 1 and port 2 write data inputs for receiving first and second data signals, a port 1 input for receiving the port 1 signal, a port 2 input for receiving the port 2 signal, and an output for providing a write data signal in response to receiving one of the port 1 and port 2 signals, the value of the write data signal corresponding to the first data if the port 1 signal is received and corresponding to the second data if the port 2 signal is received, the write driver output being operably connected to at least one of the one or more cells for writing the write data value therein when the row enable signal is generated; and
    a pulse generator operably connected to the row decoder and write driver for providing the port 1 and port 2 signals, the pulse generator having a clock input for receiving a clock signal with first and second phases, wherein the pulse generator generates the port 1 signal in the first clock phase and generates the port 2 signal in the second clock phase.

2. The array write port of claim 1 wherein the port 1 and port 2 signals are each a pulse signal.

3. The array write port of claim 2 wherein the port 1 pulse is generated from a rising clock edge to the first phase, and the port 2 pulse is generated from a falling clock edge from the first phase to the second phase.

4. The array write port of claim 3 wherein each of the port 1 and port 2 pulses has a duty cycle that is less than 25 percent relative to the clock cycle.

5. The array write port of claim 1 wherein the row decoder includes:
    a port 1 decoder gate having inputs for receiving the row address signal and the port 1 signal and an output for providing a port 1 Row signal;
    a port 2 decoder gate having inputs for receiving the row address signal and the port 2 signal and an output for providing a port 2 Row signal; and
    an OR gate having inputs connected to the port 1 and port 2 decoder gate outputs for receiving the port 1 and port 2 Row signals and an output for providing the Row enable signal if one of the port 1 and port 2 Row signals is active.

6. The array write port of claim 5 wherein the port 1 decoder gate has a plurality of decoder inputs for receiving the row address signal, wherein the decoder inputs can include inverting and non-inverting inputs for decoding a particular address associated with the row decoder.

7. The array write port of claim 1 wherein the write driver includes:
    a port 1 write gate having an input for receiving the first data signal, an input for receiving the port 1 signal, and an output for providing a port 1 data signal if the port 1 signal is active;
    a port 2 write gate having an input for receiving the second data signal, an input for receiving the port 2 signal, and an output for providing a port 2 data signal if the port 2 signal is active; and
    an OR gate having inputs for receiving the outputs from the port 1 and port 2 write gates and an output for providing the write data signal when one of the port 1 and port 2 data signals is active, whereby the write data signal corresponds to the first data signal when the port 1 signal is active and corresponds to second data signal when the port 2 signal is active.

8. The array write port of claim 1 comprising a plurality of row decoders each providing a separate Row enable signal to an associated row of separate one or more cells, wherein the plurality of rows comprise one or more columns that have a cell from each of the plurality of rows, the write driver being connected to one of the columns for providing the write data signal to each cell in the column.

9. An array write port for writing data into an array of m rows by n columns of memory cells, comprising:
    m row decoders each being operably connected to a row of n cells to provide each cell. in its row with a row enable signal for write enabling the cells, each row decoder having a row address input for receiving a row address signal, a port 1 input for receiving a port 1 signal, a port 2 input for receiving a port 2 signal, and an output for generating the row enable signal in response to being selected by the row address signal and receiving one of the port 1 and port 2 signals;
    n write drivers each for writing data into cells in one of he n cell columns, each write driver having port 1 and port 2 data input for receiving first and second data signals, a port 1 input for receiving the port 1 signal, a port 2 input for receiving the port 2 signal, and an output for providing a write data signal to the cell column in response to receiving one of the port 1 and port 2 signals, the value of the write data signal corresponding to the first data if the port 1 signal is received and corresponding to the second data if the port 2 signal is received, the write driver output being operably connected to the cell column for writing the write data value into a cell therein when the row enable signal for that cell is generated; and a pulse generator operably connected to the row decoders and write drivers for providing the port 1 and port 2 signals, the pulse generator having a clock input for receiving a clock signal with first and second phases, wherein the pulse generator generates the port 1 signal in the first clock phase and generates the port 2 signal in the second clock phase, whereby the first and second data may be separately written into the memory array during one clock cycle.

10. The array write port of claim 9 wherein the port 1 and port 2 signals are each a pulse signal.

11. The array write port of claim 10 wherein the port 1 pulse is generated from a rising clock edge to the first phase, and the port 2 pulse is generated from a falling clock edge from the first phase to the second phase.

12. The array write port of claim 11 wherein the port 1 and port 2 pulses have duty cycles that are less than 25 percent relative to the clock cycle.

13. The array write port of claim 10 wherein the row decoders each include:

a port 1 decoder gate having inputs for receiving the row address signal and the port 1 signal and an output for providing a port 1 Row signal;

a port 2 decoder gate having inputs for receiving the row address signal and the port 2 signal and an output for providing a port 2 Row signal; and an OR gate having inputs connected to the port 1 and port 2 decoder gate outputs for receiving the port 1 and port 2 Row signals and an output for providing the Row enable signal for its associated row if one of the port 1 and port 2 Row signals is active.

14. The array write port of claim 13 wherein each port 1 decoder gate has a plurality of decoder inputs for receiving the row address signal, wherein the decoder inputs can include inverting and non-inverting inputs for decoding a particular address associated with the row decoder.

* * * * *

UNITED STATES PATENT AND TRADEMARK OFFICE
CERTIFICATE OF CORRECTION

PATENT NO.    : 6,240,038 B1
DATED         : May 29, 2001
INVENTOR(S)   : Mike Barry et al.

It is certified that error appears in the above-identified patent and that said Letters Patent is hereby corrected as shown below:

Column 1,
Line 5, before "BACKGROUND" insert
-- TECHNICAL FIELD
The present invention relates generally to processors and memory array designs. In particular, the present invention relates to memory array write ports for writing to memory arrays --

Column 3,
Line 10, delete "3151" and insert therefor -- $315_1$ --

Column 6,
Line 64, delete "he" and insert therefor -- the --

Signed and Sealed this

Fourteenth Day of January, 2003

JAMES E. ROGAN
*Director of the United States Patent and Trademark Office*